United States Patent
Kang et al.

(10) Patent No.: US 8,214,727 B2
(45) Date of Patent: Jul. 3, 2012

(54) METHOD AND APPARATUS FOR TURBO ENCODING

(75) Inventors: Seung Hyun Kang, Anyang-Si (KR); Min Seok Oh, Anyang-Si (KR); Ki Hyoung Cho, Anyang-Si (KR); Jin Soo Choi, Anyang-Si (KR); Jae Hoon Chung, Anyang-Si (KR); Hyung Ho Park, Anyang-Si (KR); Ji Wook Chung, Anyang-Si (KR)

(73) Assignee: LG Electronics Inc., Seoul (KR)

( * ) Notice: Subject to any disclaimer, the term of this patent is extended or adjusted under 35 U.S.C. 154(b) by 714 days.

(21) Appl. No.: 12/377,841

(22) PCT Filed: Aug. 16, 2007

(86) PCT No.: PCT/KR2007/003912
§ 371 (c)(1),
(2), (4) Date: Feb. 17, 2009

(87) PCT Pub. No.: WO2008/020712
PCT Pub. Date: Feb. 21, 2008

(65) Prior Publication Data
US 2010/0199145 A1 Aug. 5, 2010

(30) Foreign Application Priority Data
Aug. 16, 2006 (KR) .................. 10-2006-0076990

(51) Int. Cl.
*H03M 13/03* (2006.01)
(52) U.S. Cl. ....................... 714/786; 714/755
(58) Field of Classification Search .................. 714/755, 714/786
See application file for complete search history.

(56) References Cited

U.S. PATENT DOCUMENTS

| 5,446,747 | A | 8/1995 | Berrou |
| 6,298,463 | B1 | 10/2001 | Bingeman et al. |
| 6,374,386 | B1 * | 4/2002 | Kim et al. ............... 714/786 |
| 6,675,348 | B1 | 1/2004 | Hammons, Jr. et al. |

(Continued)

FOREIGN PATENT DOCUMENTS

CN 1272252 A 11/2000
(Continued)

OTHER PUBLICATIONS

Zheng, Yi et al., "Pilot Assisted SOVA Decoding for Turbo Codes," Wireless Communications and Networking Conference—WCNC 2001, IEEE Communications Society, XP-002571209, pp. 2285-2289, Mar. 21, 2004.

(Continued)

*Primary Examiner* — Yolanda L Wilson
(74) *Attorney, Agent, or Firm* — Birch, Stewart, Kolasch & Birch, LLP (57) ABSTRACT

An apparatus for encoding an information bit stream using turbo code is provided. The apparatus includes a temporary bit generator for creating a temporary bit stream, an interleaver for independently receiving the information bit stream and the temporary bit stream, a first constituent encoder for independently receiving the information bit stream and the temporary bit stream and generating a first parity bit stream and a second constituent encoder for receiving an output of the interleaver and generating a second parity bit stream. Performance of a turbo code can be enhanced without changing a code rate by making a decoded bit stream longer.

9 Claims, 6 Drawing Sheets

U.S. PATENT DOCUMENTS

| | | | |
|---|---|---|---|
| 7,051,261 B1 * | 5/2006 | Dhamankar | 714/755 |
| 7,490,282 B2 * | 2/2009 | Spencer et al. | 714/755 |
| 8,050,347 B2 * | 11/2011 | Jeong et al. | 375/265 |
| 2002/0141433 A1 | 10/2002 | Kwon et al. | |
| 2003/0014715 A1 * | 1/2003 | Lobinger et al. | 714/791 |
| 2008/0072123 A1 * | 3/2008 | Eidson et al. | 714/786 |
| 2009/0300463 A1 * | 12/2009 | Purkovic et al. | 714/755 |

FOREIGN PATENT DOCUMENTS

| | | |
|---|---|---|
| EP | 1048114 B1 | 6/2006 |
| JP | 2002-164795 A | 6/2002 |
| JP | 2002-522943 A | 7/2002 |
| WO | WO-99/65148 A1 | 12/1999 |
| WO | WO 00/08767 A1 | 2/2000 |
| WO | WO-00/11791 A1 | 3/2000 |
| WO | WO-01/63773 A1 | 8/2001 |
| WO | WO 2005/069493 A1 | 7/2005 |

OTHER PUBLICATIONS

Berrou, Claude et al., "The Advantages of Non-Binary Turbo Codes," Proceedings of the Information Theory Workshop—ITW 2001, IEEE, XP-002574519, pp. 61-63, Sep. 3, 2001.

Berrou, et al., "The Advantages of Non-Binary Turbo Codes", Proceedings of the Information Theory Workshop, IEEE, Sep. 2-7, 2001, pp. 61-63.

Zheng et al., "Pilot Assisted SOVA Decoding for Turbo Codes", Proceedings of the IEEE Wireless Communications and Networking Conference, vol. 4, 2004, pp. 2285-2289.

* cited by examiner

▧ Temporary bit
▨ Received systematic bit

ary bit stream, an interleaver for independently receiving the information bit stream and the temporary bit stream, a first constituent encoder for independently receiving the information bit stream and the temporary bit stream and generating a first parity bit stream and a second constituent encoder for receiving an output of the interleaver and generating a second parity bit stream.

In another aspect, there is provided a method for encoding an information bit stream using turbo code. The method includes generating a temporary bit stream independent from the information bit stream and generating a parity bit stream by encoding the information bit stream and the temporary bit stream.

Advantageous Effects

Performance of turbo code can be enhanced without changing a code rate by making a decoded bit stream longer. Furthermore, reliability of the turbo code can be enhanced by generating a temporary bit stream independently from an information bit stream and allowing the temporary bit stream to influence generating a turbo coded bit stream.

MODE FOR THE INVENTION

Hereinafter, the exemplary embodiments of the present invention will be described in detail with reference to the accompanying drawings. Furthermore, in the drawings illustrating the embodiments of the invention, elements having like functions will be denoted by like reference numerals and details thereon will not be repeated.

This technique can be used for a downlink or an uplink. The downlink means communication from a base station (BS) to a mobile station (MS), whereas the uplink means communication from the MS to the BS. Generally, the BS corresponds to a fixed station that communicates with the MS, which can be referred to as a node-B, base transceiver system (BTS), access point, or the like. The MS corresponds to a fixed or mobile, which can be referred to as a user equipment (UE), user terminal (UT), subscriber station (SS), wireless device, or the like.

Figure 1:
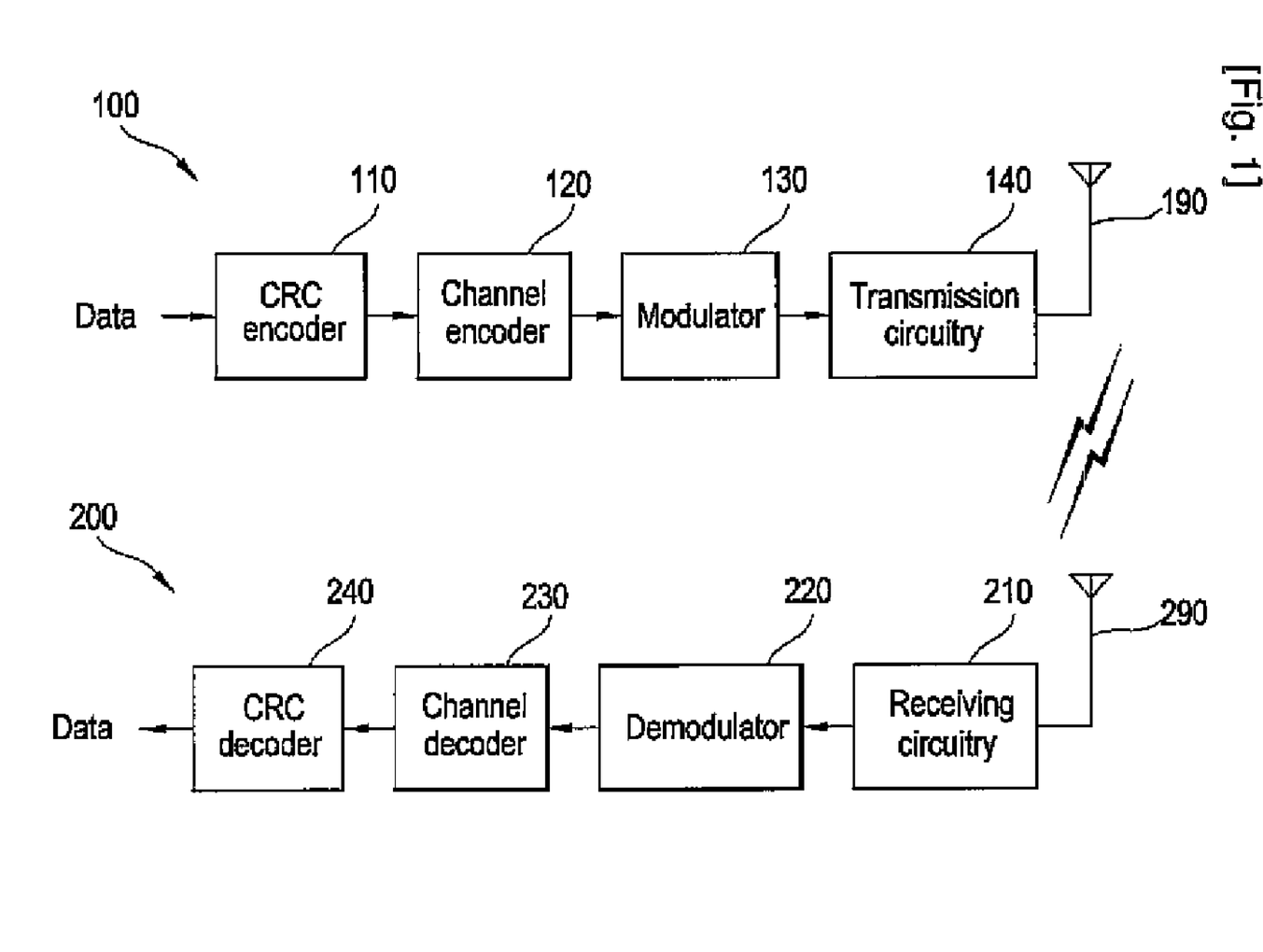
FIG. 1 is a block diagram showing a communication system.

FIG. 1 is a block diagram showing a wireless communication system. The wireless communication system is widely deployed to provide a variety of communication services, such as voices, packets, data, and the like.

METHOD AND APPARATUS FOR TURBO ENCODING

TECHNICAL FIELD

The present invention relates to wireless communication and, in particular, to method and apparatus for turbo encoding.

BACKGROUND ART

Digital signals are transmitted through a variety of propagation paths in a wireless communication system. In addition, the digital signals are reproduced from a recording medium such as a compact disk (CD) or a digital versatile disk (DVD). The digital signals may include a variety of data errors due to noises or deformations while being transmitted and reproduced through a variety of channels.

One of techniques for correcting error is an error correction coding. The error correction coding adds extra codes to data in order to restore corrected data even when errors are included in the data.

A turbo code is one of the error correction coding. A conventional turbo code uses a duo-binary recursive systematic convolutional code for a single input. Unlike the conventional turbo code for processing an input at a time, a non-binary turbo code is introduced that simultaneously processes a plurality of inputs at a time. C. Berrou, M. Jezequel, C. Douillard, and S. Kerouedan, "The advantages of non-binary turbo codes", Proc. Inf. Theory Workshop, Cairns, Australia, September 2001, pp. 61-63 can be referred to as an example of the non-binary turbo code.

Owing to advantages of the non-binary turbo code over the conventional turbo code, a duo-binary turbo code, which is one of the non-binary turbo codes, has been adopted as a standard in ETSI 301 790 of digital video broadcasting-return channel over satellite (DVB-RCS) and IEEE (Institute of Electrical and Electronics Engineers) 802.16-2004 section 8.3.3.2.3. In the above standards, the duo-binary turbo code is also referred to as a convolutional turbo code.

A code rate can be defined as the length of an information bit stream divided by the length of a coded bit stream. For example, if the length of the coded bit stream is 30 and the length of the information bit stream is 10, the code rate becomes one third.

The longer the information bit stream is, the longer the coded bit stream becomes, and performance of the turbo code is enhanced. If the length of the information bit stream is determined while the code rate remains the same, the length of the coded bit stream is also determined. Given the code rate, it is limited to improve performance of the turbo code.

Accordingly, there is a need to improve performance of the turbo code without increasing the length of the coded bit stream at a given code rate.

DISCLOSURE OF INVENTION

Technical Problem

The present invention provides a method and apparatus for turbo encoding by using temporary bits.

Technical Solution

In one aspect, there is provided an apparatus for encoding an information bit stream using turbo code. The apparatus includes a temporary bit generator for creating a tempor- Referring to FIG. 1, the wireless communication system comprises a transmitter 100 and a receiver 200. In the downlink, the transmitter 100 can be a part of the BS, and the receiver 200 can be a part of the MS. In the uplink, the transmitter 100 can be a part of the MS, and the receiver 200 can be a part of the BS. The BS can include a plurality of receivers and transmitters. The MS can include a plurality of receivers and transmitters.

The transmitter 100 includes a cyclic redundancy check (CRC) encoder 110, a channel encoder 120, a modulator 130, and a transmission circuitry 140.

The CRC encoder 110 adds CRC bits for detecting errors to input data. The input data can include text, voices, images, or other data.

The channel encoder 120 encodes the input data to form coded bits. The channel encoder 120 can perform turbo encoding.

The modulator 130 modulates the coded bits. Any modulation scheme can be used, and an m-quadrature phase shift keying (m-PSK) or an m-quadrature amplitude modulation (m-QAM) can be used. For example, the m-PSK can be a binary PSK (BPSK), a quadrature PSK (QPSK), or an 8-PSK. The m-QAM can be a 16-QAM, a 64-QAM, or a 256-QAM.

The transmission circuitry 140 converts the modulated data into an analog signal and transmits the converted analog signal to one or more receivers 200 through a transmit antenna 190.

The receiver 200 includes a receiving circuitry 210, a demodulator 220, a channel decoder 230, and a CRC decoder 240. The receiving circuitry 210 converts an analog signal received through a receive antenna 290 into a digital signal. The demodulator 220 demodulates the digital signal, and the channel decoder 230 decodes the demodulated digital signal. The channel decoder 230 can perform turbo decoding. The CRC decoder 240 confirms whether an error is detected in the decoded data.

If an error is detected, the receiver 200 can request the transmitter 100 to retransmit the data. The transmitter 100 retransmits the data in response to the retransmission request, and the receiver 200 confirms again whether an error is detected in the retransmitted data. This is called as a hybrid automatic repeat request (HARQ). For the HARQ, the receiver 200 can further include a transmission circuitry (not shown), and the transmitter 100 can further include a receiving circuitry (not shown).

The receiver 200 can transmit a channel quality indicator (CQI) to the transmitter 100. The receiver 200 feeds back a channel state through the CQI, and the transmitter 100 can adaptively change the modulation and coding scheme depending on the CQI. This is called as an adaptive modulation and coding (AMC) scheme. For the AMC scheme, the receiver 200 can further include a transmission circuitry (not shown), and the transmitter 100 can further include a receiving circuitry (not shown).

Hereinafter, a technique for coding and decoding using turbo code is described. Information bits mean data that is not encoded, and coded bits mean data that is encoded.

Figure 2:
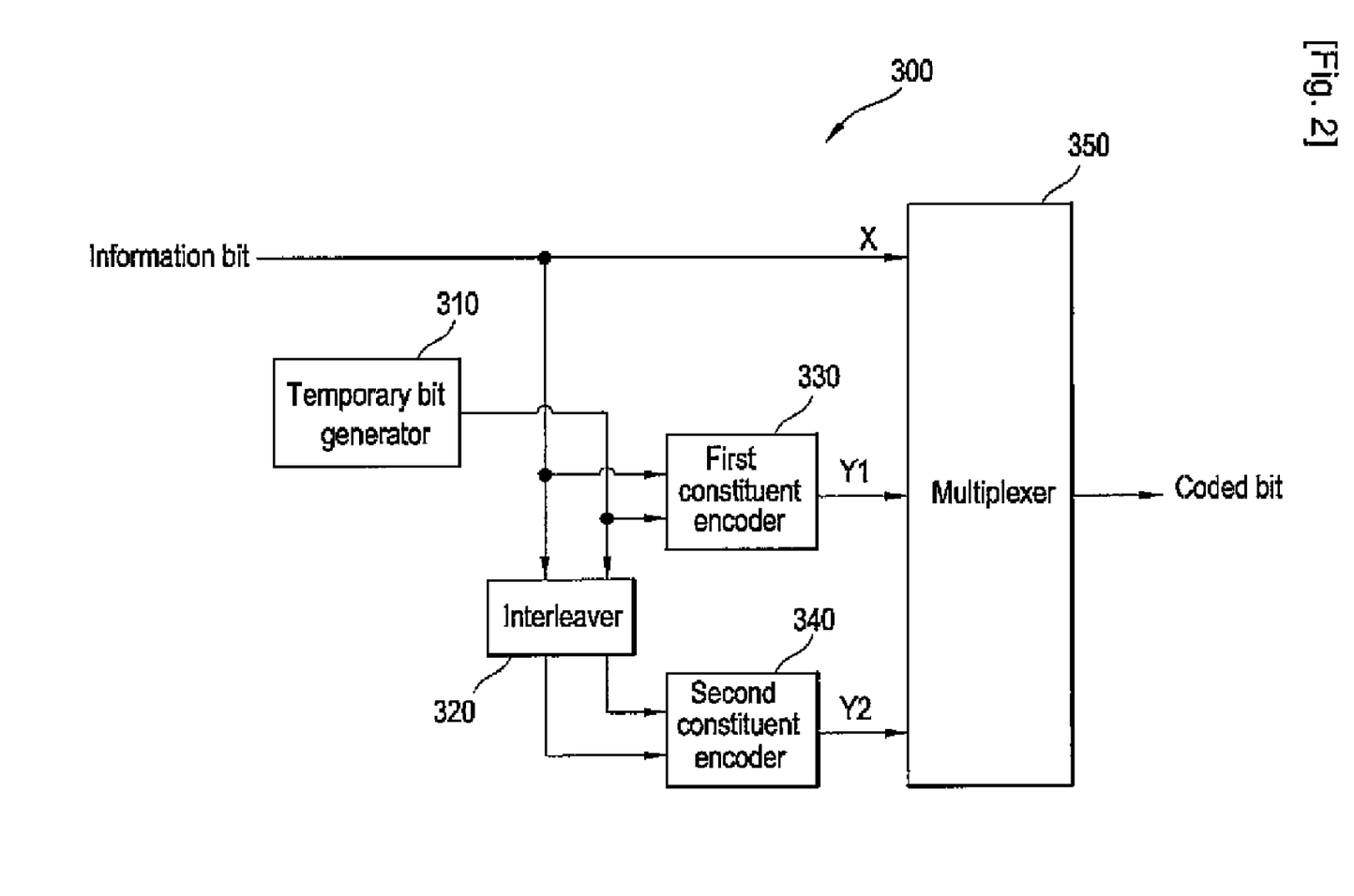
FIG. 2 is a block diagram showing an encoding apparatus according to an embodiment of the present invention.

FIG. 2 is a block diagram showing an encoding apparatus according to an embodiment of the present invention.

Referring to FIG. 2, an encoding apparatus 300 includes a temporary bit generator 310, an interleaver 320, a first constituent encoder 330, a second constituent encoder 340 and a multiplexer 350.

The temporary bit generator 310 generates a temporary bit stream whose length is the same as that of an information bit stream. The temporary bit generator 310 generates the temporary bit stream independently from the information bit stream. A temporary bit is known to both the encoding apparatus 100 and the decoding apparatus (not shown), and a rule or sequence of creating the temporary bit is not limited. For example, the temporary bit generator 310 can repeatedly generate a temporary bit having a value of '0'. Alternatively, the temporary bit generator 310 can repeatedly generate a temporary bit having a value of '1'. The temporary bit generator 310 can repeatedly generate temporary bits having a value of '01'.

The information bit stream becomes a systematic bit stream X. The systematic bit stream is a copy of the information bit stream. The temporary bit stream generated by the temporary bit generator 310 is not included in the systematic bit stream. Since the temporary bit stream is a bit stream previously known between the encoding apparatus 100 and the decoding apparatus, the temporary bit stream does not need to be transmitted.

A variety of methods can be used not to include the temporary bit stream into the systematic bit stream. For example, the output of the temporary bit generator 310 may not be connected to the input of the multiplexer 350. Alternatively, although the output of the temporary bit generator 310 is connected to the input of the multiplexer 350, the temporary bit stream can be punctured out in the multiplexer 350. Otherwise, an additional temporary bit remover (not shown) may be installed between the temporary bit generator 310 and the multiplexer 350.

The interleaver 320 interleaves the information bit stream with the temporary bit stream. The interleaver 320 receives the temporary bit stream independently from the information bit stream. The interleaver 320 receives the information bit stream as a first input and the temporary bit stream as a second input.

The first constituent encoder 330 encodes the information bit stream and the temporary bit stream and generates a first parity bit stream Y1. The first constituent encoder 330 receives the temporary bit stream independently from the information bit stream. The second constituent encoder 340 encodes a pair of bit streams outputted from the interleaver 320 and generates a second parity bit stream Y2. The first constituent encoder 330 and the second constituent encoder 340 may have the same structure of a duo-binary recursive systematic convolution code.

Although the first constituent encoder 330 and the second constituent encoder 340 respectively provide one first parity bit stream Y1 and one second parity bit stream Y2, the number of the parity bit streams provided by the first constituent encoder 330 and the second constituent encoder 340 is not limited, and two or more parity bit streams can be generated.

The multiplexer 350 multiplexes the systematic bit stream, the first parity bit stream, and the second parity bit stream. The multiplexer 350 receives the systematic bit stream X, the first parity bit stream Y1, and the second parity bit stream Y2 and generates a serially coded bit stream (turbo coded bit stream) at every unit time. The multiplexer 350 can puncture the first parity bit stream or the second parity bit stream depending on a desired code rate.

The temporary bit generator 310 generates the temporary bit stream whose length is the same as that of the information bit stream. The information bit stream becomes the systematic bit stream X and is inputted into both the interleaver 320 and the first constituent encoder 330. The temporary bit stream is inputted into both the interleaver 320 and the first constituent encoder 330 independently from the information bit stream. Each of the information bit stream and the temporary bit stream is sequentially inputted into the first constituent encoder 330 and the interleaver 320 bit by bit.

The first constituent encoder 330 receives the information bit stream and the temporary bit stream and outputs the first parity bit stream Y1. The information bit stream and the temporary bit stream are inputted into the second constituent encoder 340 through the interleaver 320, and the second constituent encoder 340 outputs the second parity bit stream Y2. The multiplexer 350 receives the systematic bit stream X, the first parity bit stream Y1, and the second parity bit stream Y2 and outputs a coded bit stream.

According to the encoding apparatus 300 configured as described above, one systematic bit X corresponds to one information bit. The first parity bit stream Y1 assigns one bit to one information bit and one temporary bit, and the second parity bit stream Y2 also assigns one bit to one information bit and one temporary bit. Accordingly, if it is assumed that the length of the information bit stream is n, the length of the coded bit stream, which is the sum of the systematic bit stream X, the first parity bit stream Y1, and the second parity bit stream Y2, becomes 3n. Therefore, the code rate becomes one third.

However, the code rate can be changed through puncturing or by creating a plurality of additional parity bit streams. For example, if the multiplexer 350 punctures the second parity bit stream Y2, the code rate becomes a half. If the first constituent encoder 330 generates two first parity bit streams Y1 and W1 and the second constituent encoder 340 generates two second parity bit streams Y2 and W2, the code rate becomes one fifth.

The temporary bit stream is generated independently from the information bit stream and inputted into the interleaver 320 and the first constituent encoder 330. An interleaving gain can be enhanced by selecting an efficient temporary bit stream based on the interleaving scheme of the interleaver 320. Furthermore, the temporary bit stream influences both of the first parity bit stream and the second parity bit stream. Reliability of the turbo coded bit stream can be enhanced since that the temporary bit stream is generally less influenced by a channel condition.

Figure 3:
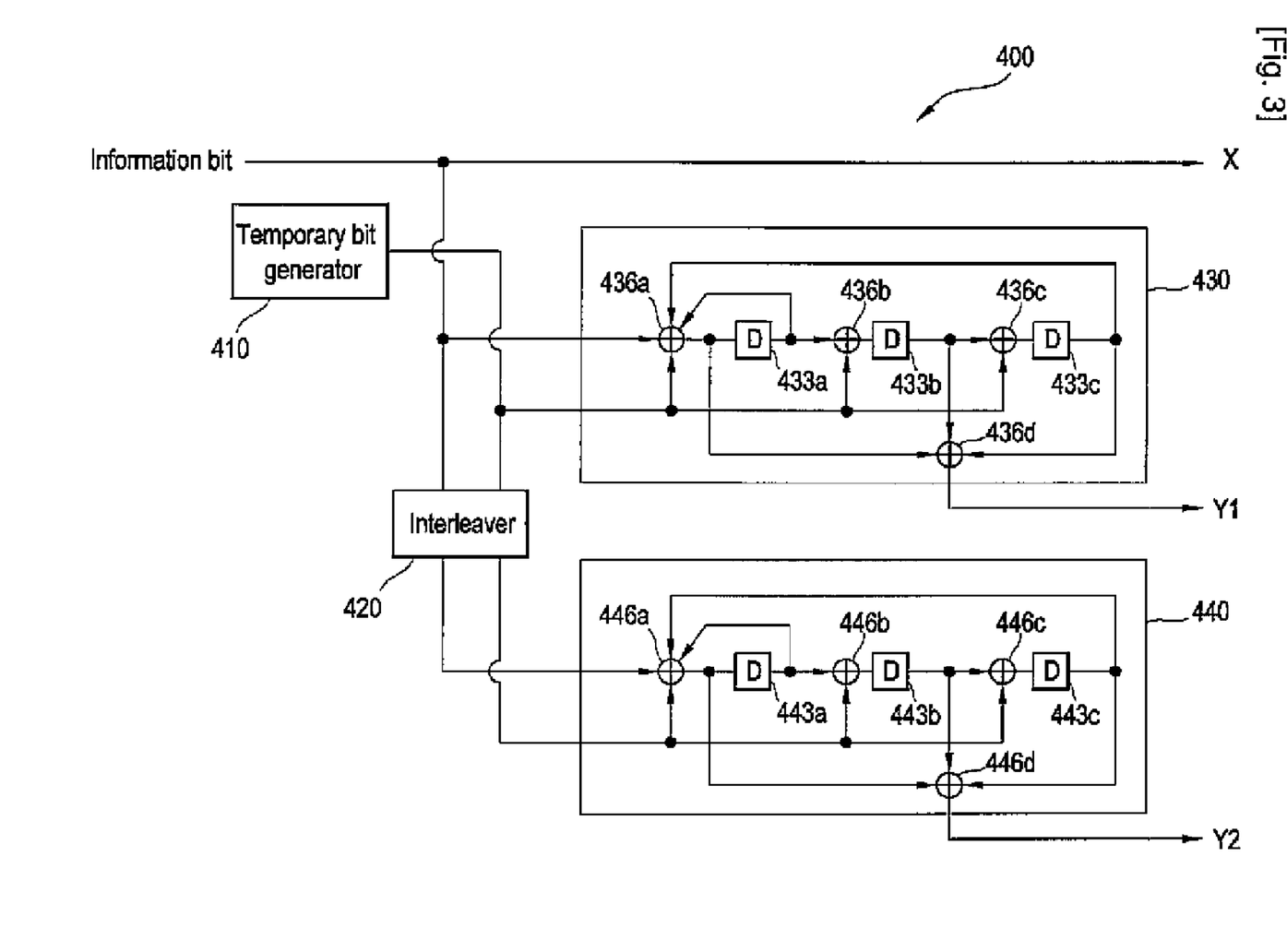
FIG. 3 is a block diagram showing an encoding apparatus according to another embodiment of the present invention.

FIG. 3 is a block diagram showing an encoding apparatus according to another embodiment of the present invention.

Referring to FIG. 3, an encoding apparatus 400 includes a temporary bit generator 410, an interleaver 420, a first constituent encoder 430, and a second constituent encoder 440. The encoding apparatus 400 implements the first constituent encoder 330 and the second constituent encoder 340 of FIG. 2.

The temporary bit generator 410 and the interleaver 420 configured to perform functionally the same as the temporary bit generator 310 and the interleaver 320 of FIG. 2.

The first constituent encoder 430 encodes an information bit stream and a temporary bit stream generated by the temporary bit generator 410 and outputs a first parity bit stream Y1. The first constituent encoder 430 includes three serially connected delays 433a, 433b, and 433c and four modulo-2 adders 436a, 436b, 436c, and 436d.

The initial state of each delay 433a, 433b, and 433c is '0'. If the information bit stream and the temporary bit stream are inputted, a first modulo-2 adder 436a performs a modulo-2 addition on an information bit, temporary bit, output bit of a first delay 433a, and output bit of a third delay 433c and provides the result of the modulo-2 addition to the first delay 433a. A second modulo-2 adder 436b performs a modulo-2 addition on the output bit of the first delay 433a and the temporary bit and provides the result of the modulo-2 addition to a second delay 433b. A third modulo-2 adder 436c performs a modulo-2 addition on the output bit of the second delay 433b and the temporary bit and provides the result of the modulo-2 addition to the third delay 433c. A fourth modulo-2 adder 436d performs a modulo-2 addition on the output bit of the first modulo-2 adder 436a, output bit of the second delay 433b, and output bit of the third delay 433c. The output of the fourth modulo-2 adder 436d becomes the first parity bit. Therefore, the polynomial of the first parity bit is $1+D^2+D^3$.

The second constituent encoder 440 encodes two interleaved bit streams and outputs a second parity bit stream Y2. The second constituent encoder 440 includes three serially connected delays 443a, 443b, and 443c and four modulo-2 adders 446a, 446b, 446c, and 446d. The second constituent encoder 440 operates in the same manner as the first constituent encoder 430. Therefore, the polynomial of the second parity bit is $1+D^2+D^3$.

Figure 4:
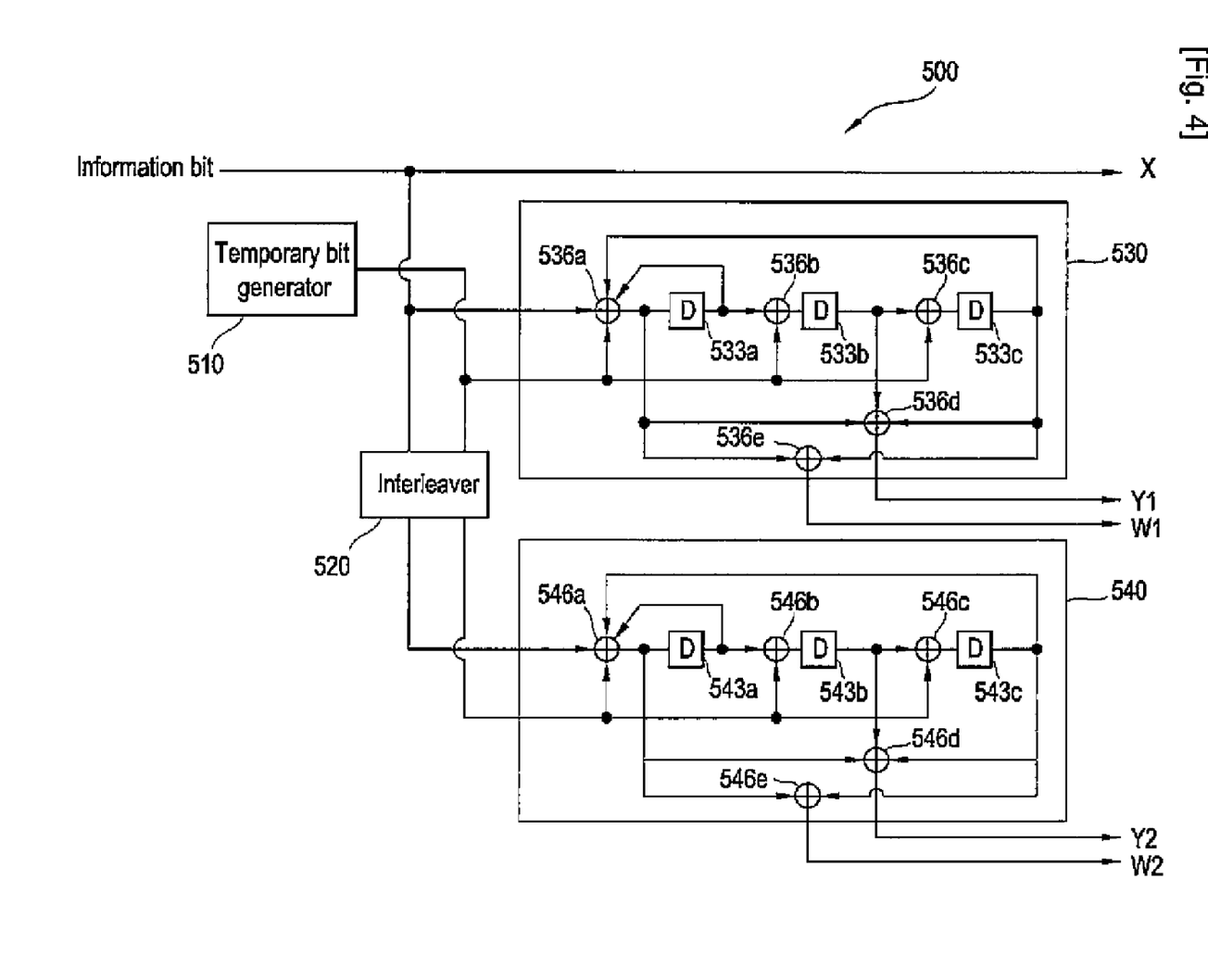
FIG. 4 is a block diagram showing an encoding apparatus according to still another embodiment of the present invention.

FIG. 4 is a block diagram showing an encoding apparatus according to still another embodiment of the present invention.

Referring to FIG. 4, an encoding apparatus 500 comprises a temporary bit generator 510, an interleaver 520, a first constituent encoder 530 and a second constituent encoder 540. The encoding apparatus 500 is different from the encoding apparatus 400 of FIG. 3 in that each of the first constituent encoder 530 and the second constituent encoder 540 outputs two parity bit streams.

The first constituent encoder 530 outputs two first parity bit streams Y1 and W1. The polynomial of the first bit stream Y1 of the first parity bit streams is $1+D^2+D^3$. A modulo-2 adder 536e performs a modulo-2 addition on the output bit of a first modulo-2 adder 536a and the output bit of a third delay 533c. Therefore, the polynomial of the second bit stream W1 of the first parity bit streams is $1+D^3$.

The second constituent encoder 540 outputs two second parity bit streams Y2 and W2. The polynomial of the first bit stream Y2 of the second parity bit streams is $1+D^2+D^3$. In addition, the polynomial of the second bit stream W2 of the second parity bit streams is $1+D^3$.

Since four parity bit streams are generated for one information bit stream X, the code rate becomes one fifth.

Figure 5:
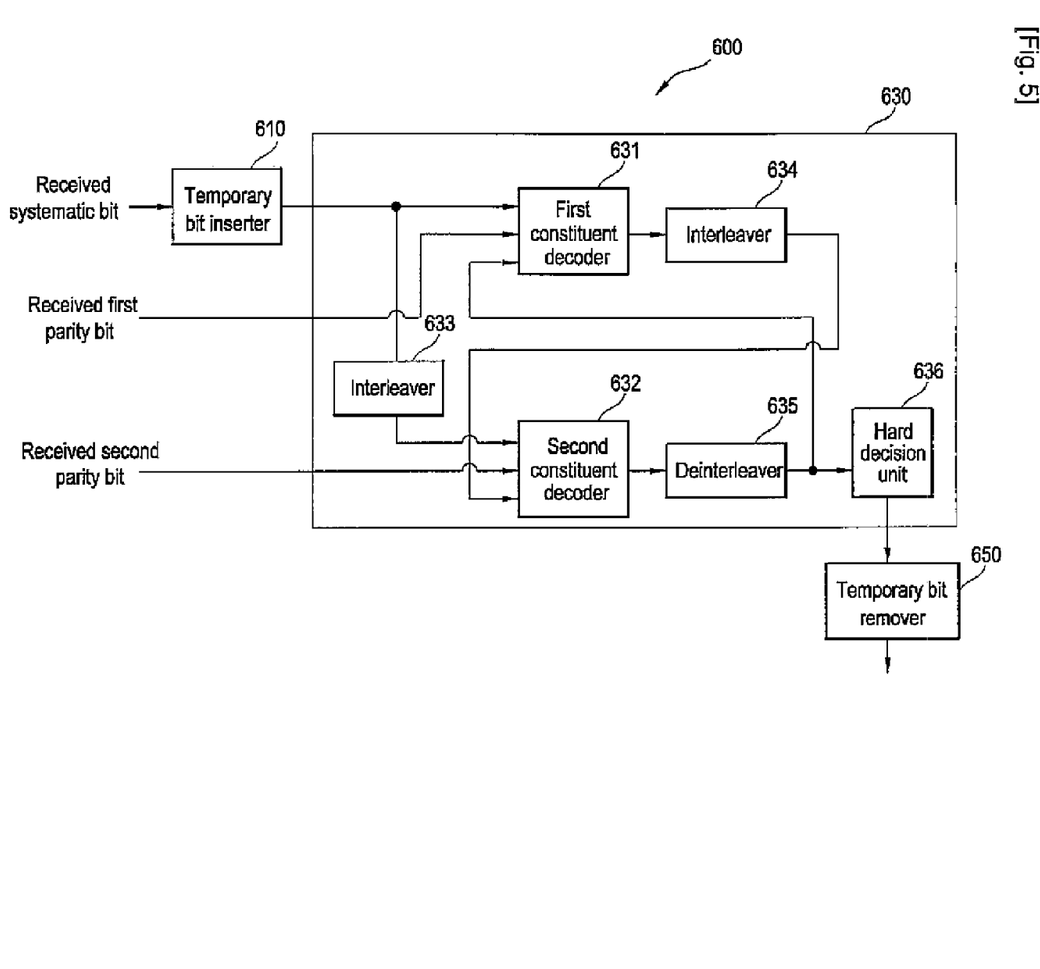
FIG. 5 is a block diagram showing a decoding apparatus according to an embodiment of the present invention.

FIG. 5 is a block diagram showing a decoding apparatus according to an embodiment of the present invention.

Referring to FIG. 5, a decoding apparatus 600 includes a temporary bit inserter 610, a turbo decoder 630 and a temporary bit remover 650. An input of the decoding apparatus 600 includes a received systematic bit, a received first parity bit and a received second parity bit, which are detected by demodulating a received signal. The received systematic bit corresponds to a systematic bit outputted from the encoding apparatus 300. The received first parity bit corresponds to a first parity bit outputted from the encoding apparatus 300, and the received second parity bit corresponds to a second parity bit outputted from the encoding apparatus 300.

Each of the values inputted into the decoding apparatus 600 is a soft value of a bit received from a channel. The received systematic bit means a soft value of the systematic bit received from the channel, the received first parity bit means a soft value of the first parity bit received from the channel, and the received second parity bit means a soft value of the second parity bit received from the channel.

The temporary bit inserter 610 inserts a temporary bit stream into a received systematic bit stream. The inserted temporary bit stream is the same as the temporary bit stream generated by the temporary bit generator of the encoding apparatus. An inserted value is a soft value of a temporary bit. A bit stream into which the temporary bit stream is inserted is called as a decoded bit stream.

The turbo decoder 630 includes two constituent decoders 631 and 632, two interleavers 633 and 634, and a deinterleaver 635.

The turbo decoder is a general turbo code decoder that operates in a repeated manner. A first constituent decoder 631 and a second constituent decoder 632 respectively correspond to the first constituent encoder and the second constituent encoder of the encoding apparatus. The first constituent decoder 631 operates the inputted decoded bit stream and the received first parity bit stream and generates probability estimation of each data bit for being 1 or 0. The probability estimation is inputted into the second constituent decoder 632 together with the received second parity bit stream and the interleaved decoded bit stream. This process is repeated until a predetermined number of iterations are completed or a predetermined bit error rate (BER) is satisfied. After the repetition is completed, a hard decision unit 636 makes a hard decision on the soft value and outputs bit data.

The temporary bit remover 650 removes the temporary bit stream from a bit data stream outputted from the turbo decoder 630. If the temporary bit stream is removed, an original information bit stream is restored.

A maximum A-posteriori Probability (MAP) algorithm can be applied to the constituent decoders 631 and 632. The MAP algorithm is a trellis decoding algorithm such as the Viterbi algorithm. If the MAP algorithm is performed in a logarithmic domain, it is called as a log-MAP algorithm.

Although the length of the encoded bit stream transmitted from the encoding apparatus to the channel is 3n, the length of the decoded bit stream decoded in the decoding apparatus 600 becomes 4n due to the addition of the temporary bit stream of length n. Reliability of the turbo code can be enhanced without changing a actual code rate by making the decoded bit stream longer.

Figure 6:
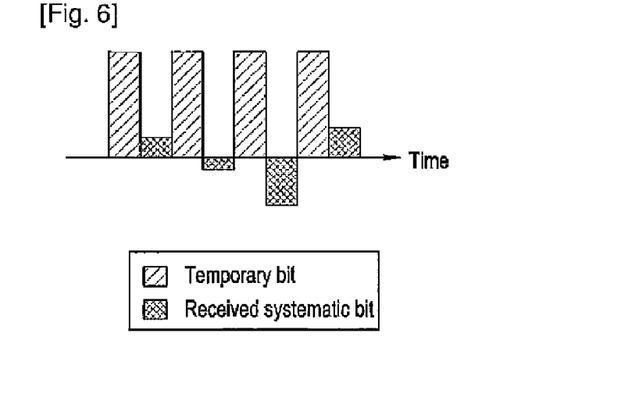
FIG. 6 is a schematic diagram showing a temporary bit stream inserted into a received systematic bit stream.

FIG. 6 is a schematic diagram showing a temporary bit stream inserted into a received systematic bit stream.

Referring to FIG. 6, when a temporary bit stream is inserted into a received systematic bit stream, the temporary bit stream can have high reliability. For example, a soft value of the temporary bit stream can be larger than the maximum soft value of the received systematic bit stream. Alternatively, a soft value of the temporary bit stream can be one or more times larger than the average value of the received systematic bit stream.

The temporary bit stream having a uniform magnitude is shown in the figure, but it is not limited thereto. The magnitude of the temporary bit stream can be changed.

The temporary bit stream is independently inserted to have high reliability, and therefore, likelihood that can be selected due to a wrong path can be limited, and reliable decoding can be accomplished.

Figure 7:
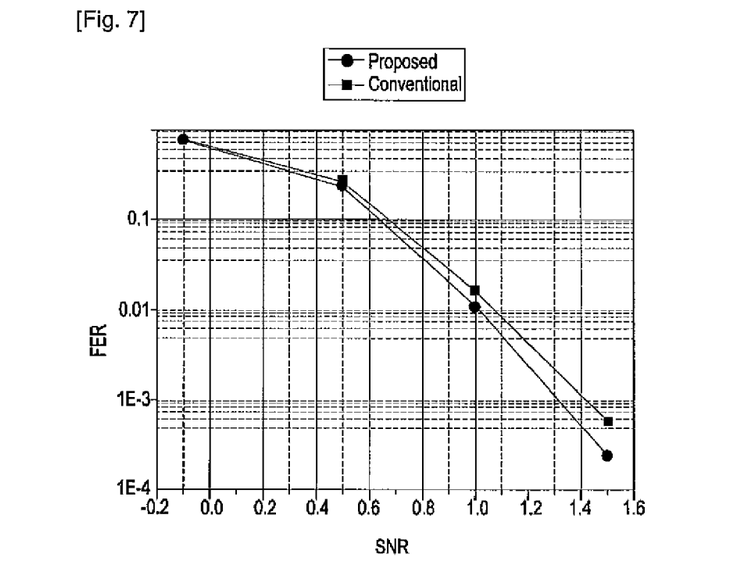
FIG. 7 shows a graph comparing a simulation result of the present invention with that of a conventional technique.

FIG. 7 shows a graph comparing a simulation result of the present invention with that of a conventional technique. The length of an information bit stream is 480 bits, and a BPSK modulation, eight times repetitive decoding, and the log-MAP algorithm are used in an additive white Gaussian noise (AWGN) channel environment. A conventional duo-binary turbo code having a code rate of one third is used as a conventional technique.

Referring to FIG. 7, it shows that the frame error rate (FER) has been improved in the present invention compared with that of the conventional technique.

Figure 8:
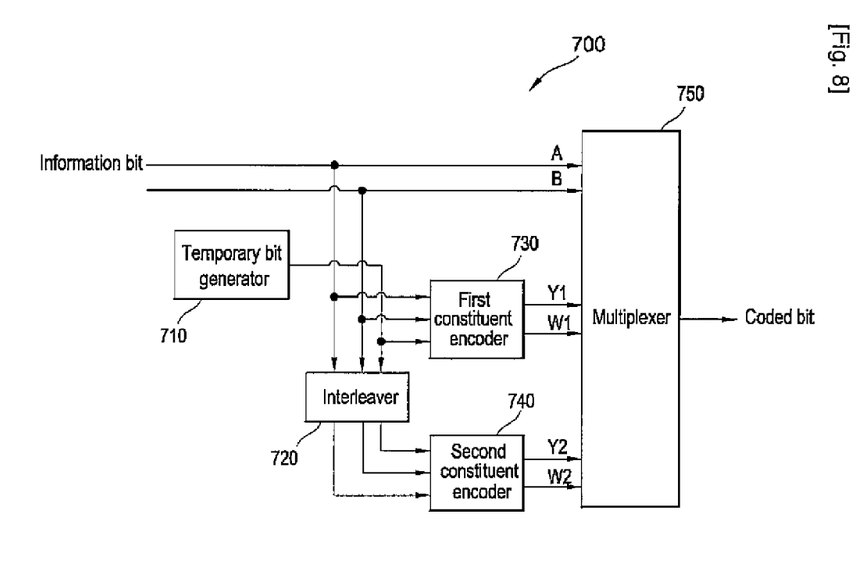
FIG. 8 is a block diagram showing an encoding apparatus according to still another embodiment of the present invention.

FIG. 8 is a block diagram showing an encoding apparatus according to still another embodiment of the present invention.

Referring to FIG. 8, an encoding apparatus 700 includes a temporary bit generator 710, an interleaver 720, a first constituent encoder 730, a second constituent encoder 740 and a multiplexer 750. The encoding apparatus 700 is different from the encoding apparatus 300 of FIG. 2 in that a pair of information bits is inputted at a time.

The first constituent encoder 730 encodes two information bit streams and a temporary bit stream and generates two first parity bit streams Y1 and W1. The second constituent encoder 740 encodes three bit streams outputted from the interleaver 720 and generates two second parity bit streams Y2 and W2. The first constituent encoder 730 and the second constituent encoder 740 may have the same structure of a triple-binary recursive systematic convolution code.

The multiplexer 750 receives a pair of systematic bit streams A and B, a pair of the first parity bit streams Y1 and W1, and a pair of the second parity bit streams Y2 and W2 and generates a serially coded bit stream at every unit time.

If it is assumed that the length of the information bit stream is 2n, the length of the coded bit stream, which is the sum of the systematic bit streams A and B, the first parity bit streams Y1 and W1, and the second parity bit streams Y2 and W2, becomes 6n. Therefore, the code rate becomes one third.

Alternatively, if the first constituent encoder 730 and the second constituent encoder 740 respectively generate one parity bit stream, the code rate becomes a half.

The encoding apparatus is described to receive two information bits in parallel, but the encoding apparatus can receive m ($m \geq 1$) information bits in parallel. Furthermore, k ($k \geq 1$) temporary bit generators can be arranged. At this point, the constituent encoders may have a structure of a (m+k) binary recursive systematic convolution code.

Examples of encoding apparatuses applied to a communication system are described in the above embodiments. However, the encoding apparatus can be applied to other systems in which a turbo code is used. For example, the encoding apparatus can be applied to a recording apparatus for recording data onto a recording medium such as a CD, DVD, magnetic tape, or the like, or to a reproducing apparatus for reproducing data from a recording medium on which data is recorded.

Although a single-input single-output (SISO) system having a single transmission antenna and a single receiving antenna has been described above, the spirits of the present invention can also be applied as is to a multiple-input multiple-output (MIMO) system having a plurality of transmit antennas and a plurality of receiving antennas.

An apparatus described in connection with the embodiments disclosed herein may be implemented by hardware or a combination of hardware and software. The steps of a method described in connection with the embodiments disclosed herein may be implemented by hardware, software or a combination thereof. The hardware may be implemented by an application specific integrated circuit (ASIC) that is designed to perform the above function, a digital signal processing (DSP), a programmable logic device (PLD), a field programmable gate array (FPGA), a processor, a controller, a microprocessor, the other electronic unit, or a combination thereof. A module for performing the above function may implement the software. The software may be stored in a memory unit and executed by a processor. The memory unit or the processor may employ a variety of means that is well known to those skilled in the art.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims. Therefore, all changes and modifications that fall within the metes and bounds of the claims, or equivalence of such metes and bounds are intended to be embraced by the appended claims.

The invention claimed is:

1. An apparatus for encoding an information bit stream using turbo code, the apparatus comprising:
    a temporary bit generator configured to generate a temporary bit stream, the length of the temporary bit stream being equal to the length of the information bit stream;
    an interleaver configured to generate an interleaved information bit stream and an interleaved temporary bit stream, the interleaved information bit stream being generated by interleaving the information bit stream, the interleaved temporary bit stream being generated by interleaving the temporary bit stream;
    a first constituent encoder configured to generate a first parity bit stream from the information bit stream and the temporary bit stream;
    a second constituent encoder configured to generate a second parity bit stream from the interleaved information bit stream and the interleaved temporary bit stream; and
    a multiplexer configured to generate a multiplexed bit stream associated with the information bit stream, the first parity bit stream, and the second parity bit stream.

2. The apparatus according to claim 1, wherein the first constituent encoder and the second constituent encoder have a same structure of a duo-binary recursive systematic convolution code.

3. The apparatus according to claim 1, wherein the generated multiplexed bit stream is a serially-coded bit stream.

4. The apparatus according to claim 3, wherein the serially-coded bit stream has a length equivalent to three times a designated length of the information bit stream.

5. The apparatus according to claim 1, wherein the multiplexer is configured to penetrate the first parity bit stream or the second parity bit stream, in order to employ a desired code rate.

6. A method for encoding an information bit stream using turbo code, the method comprising:
    generating a temporary bit stream, the length of the temporary bit stream being equal to the length of the information bit stream;
    generating an interleaved information bit stream by interleaving the information bit stream;
    generating an interleaved temporary bit stream by interleaving the temporary bit stream;
    generating a first parity bit stream from the information bit stream and the temporary bit stream;
    generating a second parity bit stream from the interleaved information bit stream and the interleaved temporary bit stream; and
    generating a multiplexed bit stream associated with the information bit stream, the first parity bit stream, and the second parity bit stream.

7. The method according to claim 6, wherein the generated multiplexed bit stream is a serially-coded bit stream.

8. The method according to claim 7, wherein the serially-coded bit stream has a length equivalent to three times a designated length of the information bit stream.

9. The method according to claim 6, wherein generating the multiplexed bit stream further comprises penetrating the first parity bit stream or penetrating the second parity bit stream, in order to employ a desired code rate.

* * * * *